US008761384B2

(12) United States Patent
Yu

(10) Patent No.: US 8,761,384 B2
(45) Date of Patent: *Jun. 24, 2014

(54) METHOD AND CIRCUITRY FOR MATCHING IMPEDANCE

(75) Inventor: Zhuwei Yu, Shenzhen (CN)

(73) Assignee: ZTE Corporation, Shenzhen, Guangdong Province (CN)

(*) Notice: Subject to any disclaimer, the term of this patent is extended or adjusted under 35 U.S.C. 154(b) by 0 days.

This patent is subject to a terminal disclaimer.

(21) Appl. No.: 13/642,138

(22) PCT Filed: Aug. 24, 2011

(86) PCT No.: PCT/CN2011/078852
§ 371 (c)(1),
(2), (4) Date: Oct. 19, 2012

(87) PCT Pub. No.: WO2012/065469
PCT Pub. Date: May 24, 2012

(65) Prior Publication Data
US 2013/0234804 A1 Sep. 12, 2013

(30) Foreign Application Priority Data

Nov. 15, 2010 (CN) .......................... 2010 1 0543764

(51) Int. Cl.
*H04M 7/04* (2006.01)
*H03H 11/30* (2006.01)
*H04M 1/76* (2006.01)
*H03H 7/40* (2006.01)

(52) U.S. Cl.
CPC ................ *H03H 11/30* (2013.01); *H03H 7/40* (2013.01); *H04M 1/76* (2013.01)
USPC .......................................... 379/398

(58) Field of Classification Search
USPC .......................................... 379/398
See application file for complete search history.

(56) References Cited

U.S. PATENT DOCUMENTS 5,185,789 A * 2/1993 Hanon et al. .................. 379/395
5,333,192 A * 7/1994 McGinn .................... 379/413.04
(Continued)

FOREIGN PATENT DOCUMENTS

WO 9529566 A1 11/1995

OTHER PUBLICATIONS

International Search Report for PCT/CN2011/078852 dated Oct. 20, 2011.

*Primary Examiner* — Simon Sing
(74) *Attorney, Agent, or Firm* — Ling Wu; Stephen Yang; Ling and Yang Intellectual Property LLC

(57) ABSTRACT

Disclosed are a method and a circuit for impedance matching. The method comprises: a peripheral impedance detection module detecting an impedance of a subscriber telephone and outputting information about the impedance of the subscriber telephone; an analog switch switching module providing an impedance matching path between the impedance of the subscriber telephone and an impedance matching module according to the information about the impedance of the subscriber telephone output by the peripheral impedance detection module; the impedance matching module providing a corresponding impedance through the impedance matching path provided by the analog switch switching module to match to said impedance of the subscriber telephone. By the present invention, the impedance matching is achieved when a wireless access box communicates with telephones with various impedance modes. The matching process is flexible, automatic, and does not need manual configuration, and the technology is simple, reliable, and of low cost.

10 Claims, 2 Drawing Sheets

(56) References Cited

U.S. PATENT DOCUMENTS

| | | | |
|---|---|---|---|
| 5,500,894 A * | 3/1996 | Hershbarger | 379/399.02 |
| 5,517,565 A * | 5/1996 | Cotreau | 379/252 |
| 6,185,280 B1 * | 2/2001 | Jarboe et al. | 379/3 |
| 6,205,218 B1 * | 3/2001 | Fischer et al. | 379/403 |
| 6,331,785 B1 * | 12/2001 | Swanson et al. | 326/30 |
| 6,400,822 B1 * | 6/2002 | Anozie | 379/398 |
| 6,507,651 B1 * | 1/2003 | Claussner | 379/402 |
| 6,515,485 B1 * | 2/2003 | Bullock et al. | 324/601 |
| 6,538,506 B2 * | 3/2003 | Hareyama | 330/51 |
| 6,724,890 B1 * | 4/2004 | Bareis | 379/394 |
| 6,826,155 B1 * | 11/2004 | Gershon | 370/244 |
| 6,911,875 B2 | 6/2005 | Lee et al. | |
| 7,020,274 B1 * | 3/2006 | Burnett | 379/387.02 |
| 7,675,922 B2 * | 3/2010 | Magendanz et al. | 370/401 |
| 2003/0102932 A1 | 6/2003 | Lee et al. | |
| 2008/0056231 A1 | 3/2008 | Langner | |

* cited by examiner

METHOD AND CIRCUITRY FOR MATCHING IMPEDANCE

TECHNICAL FIELD

The present invention relates to the analog interface technology of communication equipments, and more especially, to a method and circuit for impedance matching.

BACKGROUND OF THE RELATED ART

The wireless access box is a wireless access terminal and is connected with the telephones through the interface provided by the subscriber interface circuit (such as the RJ11 interface), and it can use a variety of modes to implement wireless access services of different operators around the world, and achieve voice communications within the wireless network coverage.

In the existing router or the Ethernet switch, the transmission interfaces for the router or switch to interconnect and use can be implemented at the same time. In the interface of these existing equipments, generally the European standard E1 interface and the North American T1 interface are used, and these interfaces have different impedance types. Wherein, the E1 interfaces usually supports the peripherals with the impedances of 120 ohm and 75 ohm, and the T1 port supports the peripheral of 100 ohm. The telephones used by subscribers from different countries are different, and their internal impedances are also divided into three different types, thus the impedance matching of the wireless access box and the telephone becomes an issue.

At present, there is a solution for the three impedance standards of the E1 and T1 interfaces to change the parameter of the wireless access box interface circuit board and respectively select different impedance to match. Each interface mode corresponds to an interface circuit board respectively, thus a total of three interface circuit boards with different impedances should be designed in order to meet the demand for delivering the boards to a variety of regions. This solution has at least two disadvantages: an additional interface circuit board should be added, thus the design cost increases; there are such a great variety of interface circuit boards, thus the product configuration and management are not flexible enough.

Another solution is the manual configuration, that is, a DIP switch is designed in the motherboard of the wireless access box, and the DIP switch is dialed to select different impedance modes. This solution also has the following disadvantages:

(1) to achieve the matching of the three impedance modes, at least a 4-way DIP switch should be designed. Not only a position of the DIP switch should be designed in the appearance of the wireless access box, but also the cost of the DIP switch is high, extra PCB area of the motherboard of the wireless access box should be added, which doubly increases the cost;

(2) the actual operation is complicated, the subscriber's use needs additional instruction, otherwise, it is prone to manual errors;

(3) the metal reed contact is used within the DIP switch, and after a long time of many operations, the metal reed is likely to age, thus leading to poor contact and poor reliability.

SUMMARY OF THE INVENTION

The technical problem to be solved in the present invention is to provide a method and circuit for impedance matching in order to achieve automatic and flexible impedance matching.

In order to solve the aforementioned problem, the present invention provides an impedance matching circuit, comprising a peripheral impedance detection module, an analog switch switching module and an impedance matching module that are connected in turn, wherein, the peripheral impedance detection module is set to: detect impedance of a subscriber telephone and output information about the impedance of the subscriber telephone;

the analog switch switching module is set to: provide an impedance matching path between the impedance of the subscriber telephone and the impedance matching module according to the information about the impedance of the subscriber telephone output by the peripheral impedance detection module;

the impedance matching module is set to: provide a corresponding impedance, through the impedance matching path provided by the analog switch switching module, to match said impedance of the subscriber telephone.

Preferably, the method has the following feature:

the peripheral impedance detection module comprises an analog to digital conversion (ADC) detection module, and the ADC detection module is set to: output the information about the impedance of the subscriber telephone in the form of high or low level according to a value of the impedance of the subscriber telephone.

Preferably, the method has the following feature:

said ADC detection module comprises a resister R0, a resistor R1, a resistor R2, a resistor R3, a voltage comparator N1 and a voltage comparator N2, wherein, one end of the resistor R0 is connected to the system power supply Vcc, and the other end is connected to the impedance Rx of the subscriber telephone, as well as negative input ends of the voltage comparator N1 and the voltage comparator N2; one end of the resistor R1 is connected to ground, and the other end is connected to a positive input end of the voltage comparator N1 and the resistor R2; one end of the resistor R2 is connected to the positive input end of the voltage comparator N1 and the resistor R1, and the other end is connected to the positive input end of the voltage comparator N2 and the resistor R3; one end of the resistors R3 is connected to the system power source Vcc and the other end is connected to the positive input end of the voltage comparator N2 and the resistor R2; the resistor R1, the resistor R2, and the resistor R3 are divider resistors and provide reference voltages to the voltage comparators N1 and N2; the output ends of the voltage comparators N1 and N2 are connected to the analog switch switching module, according to the value of the impedance Rx of the subscriber phone, the voltage comparator N1 and the voltage comparator N2 output high or low level.

Preferably, the method has the following feature:

said impedance matching module comprises a resistor Ry and a resistor Rz, and the analog switch switching module is also set to:

when both the voltage comparator N1 and the voltage comparator N2 output high level, set the impedance Rx of the subscriber telephone connect to the resistor Rz, and a total input impedance is the value of the impedance Rx of the subscriber telephone plus the value of the resistor Rz;

when the voltage comparator N1 outputs the low level and the voltage comparator N2 outputs the high level, set the impedance Rx of the subscriber telephone to connect to the resistor Ry, and the total input impedance is the value of the impedance Rx of the subscriber telephone plus the value of the resistor Ry;

when both the voltage comparator N1 and the voltage comparator N2 output the low level, set the impedance Rx of the subscriber telephone to connect to the resistor Ry and the resistor Rz, and the total input impedance is the value of the impedance Rx of the subscriber telephone plus the value of the resistor Ry parallel with the resistor Rz.

Preferably, the method has the following feature:

the analog switch switching module is an analog switch S, an IN1 end of the analog switch S is connected to the output end of the voltage comparator N1, and an IN2 end of the analog switch S is connected to the output end of the voltage comparator N2, NO1 and NC1 of the analog switch S are connected to an end of the impedance Rx of the subscriber telephone that is not connected to the ground, and NO2 is connected to one end of the resistor Ry, and NC2 is connected to one end of the resistor Rz; when both the voltage comparator N1 and the voltage comparator N2 output high level, the NC1 end and the NC2 end of the analog switch S are connected so that the impedance Rx of the subscriber telephone is connected to the resistor Rz; when the voltage comparator N1 outputs low level while the voltage comparator N2 outputs high level, the NC1 end and the NO2 end of the analog switch S are connected so that the impedance Rx of the subscriber telephone is connected to the resistor Ry; when both the voltage comparator N1 and the voltage comparator N2 output low level, the four ends NC1, NC2, N01 and N02 of the analog switch S are connected so that the impedance Rx of the subscriber telephone is connected to the resistor Ry and the resistor Rz.

Preferably, the method has the following feature:

said analog switch switching module comprises a field effect transistor (FET) VT1 and a field effect transistor VT2, wherein, a grid of the FET VT1 is connected to the output end of the voltage comparator N1, and the grid of the FET VT2 is connected to the output end of the voltage comparator N2, drains of the FET VT1 and the FET VT2 are connected to the end of the impedance Rx of the subscriber telephone that is not connected to the ground, a source of the FET VT1 is connected to one end of the resistor Ry, and the source of the FET VT2 is connected to one end of the resistor Rz; when both the voltage comparator N1 and the voltage comparator N2 output high level, the FET VT1 is in conducting state and the VT2 FET is in non-conducting state so that the impedance Rx of the subscriber telephone is connected to the resistor Rz; when the voltage comparator N1 outputs low level and the voltage comparator N2 outputs high level, the FET VT1 is in the non-conducting state and the FET VT2 is in the conducting state, so that the impedance Rx of the subscriber telephone is connected to the resistor Ry; when the voltage comparator N1 and the voltage comparator N2 output low level, the field effect transistor VT1 and the field effect transistor VT2 are in the conducting state, so that the impedance Rx of the subscriber telephone is connected to both the resistor Ry and the resistor Rz.

Preferably, the method has the following feature:

the reference voltage provided by the resistor R1, the resistor R2, and the resistor R3 for the voltage comparator N1 is +1.8V, and the reference voltage provided for the voltage comparator N2 is +3.3V, and the system power supply Vcc is +5V.

Preferably, the method has the following feature:

the value of the resistor Ry is 50 ohm, the value of the resistor Rz is 75 ohm, and the total input impedance is 150 ohm.

In order to solve the aforementioned problem, the present invention provides a wireless access box, comprising the aforementioned impedance matching circuit.

In order to solve the aforementioned problem, the present invention provides a impedance matching method, comprising:

a peripheral impedance detection module detecting an impedance of a subscriber telephone and outputting information about the impedance of the subscriber telephone;

an analog switch switching module providing an impedance matching path between the impedance of the subscriber telephone and an impedance matching module according to the information about the impedance of the subscriber telephone output by the peripheral impedance detection module;

the impedance matching module providing a corresponding impedance through the impedance matching path provided by the analog switch switching module to match to said impedance of the subscriber telephone. Through the aforementioned solution of the present invention, the impedance matching can be implemented when the wireless access box communicates with phones with a variety of different impedance modes, the matching process is automatic and flexible, and no manual configuration is needed, and the implementation technology is simple, reliable, and of low cost.

PREFERRED EMBODIMENTS OF THE PRESENT INVENTION

The basic idea of the present invention is, in the case of without adding an external interface matching circuit and the DIP switch, to implement the automatic and flexible impedance matching for three external telephone interfaces with different impedance modes.

Figure 1:
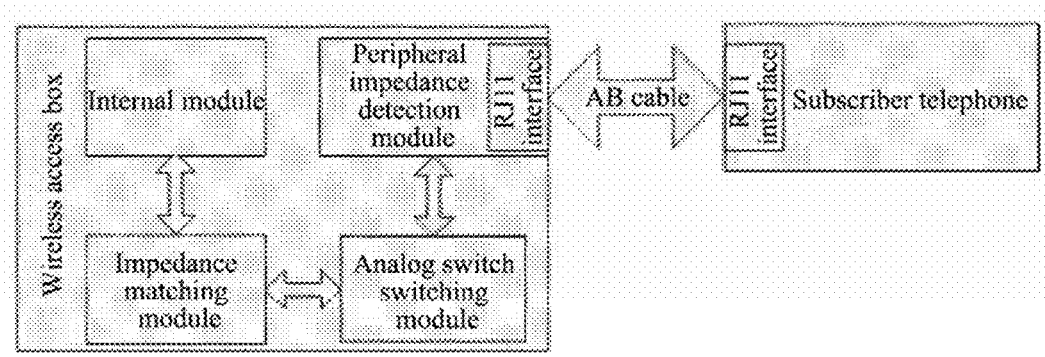
FIG. 1 is a schematic diagram of impedance matching of the wireless access box interface in accordance with an embodiment of the present invention.

As shown in FIG. 1, the subscriber phone is connected to a wireless access box via its communication interface (the RJ11 interface) as well as the AB cable. The AB cable has two functions: one is to implement the communication between the subscriber telephone and the wireless access box, and the other is that the internal impedance of the subscriber phone can be detected through the AB cable. The wireless access box comprises the interface impedance matching circuit and the internal module, wherein, the interface impedance matching circuit comprises the peripheral impedance detection module, the analog switch switching module and the impedance matching module that are connected in turn, the peripheral impedance detection module detects the impedance of the subscriber telephone and outputs the information about the impedance of the subscriber telephone; the analog switch switching module provides the impedance matching path between the impedance of the subscriber telephone and the impedance matching module according to the information about the impedance of the subscriber telephone output by the peripheral impedance detection module; the impedance matching module provides the corresponding impedance according to the path provided by the analog switch switching module, and matches with the impedance of the subscriber telephone. The internal module is used to implement other parts of the functions for the communicating of the wireless access box.

The ultimate effect of the impedance matching is to meet the condition that the value of the impedance from the output end of the wireless access box subscriber line interface chip (SLIC) to the subscriber telephone end must be constant, and the value of the impedance must meet the impedance requirements within the subscriber line interface chip. Only when the internal impedance matches with the external one that the distortion of the signal produced during the transmission can be avoided.

Specifically, the peripheral impedance detection module might comprise an ADC (analog to digital conversion) detection module, said ADC detection module outputs the information about the impedance of the subscriber telephone in the form of high or low level according to the value of impedance of the subscriber telephone.

The impedance matching module might comprise the impedance compensation groups matching with three different impedances of subscriber telephones to achieve the impedance consistence inside the internal module after the subscriber telephones with the three different impedances access to the wireless access box.

Figure 2:
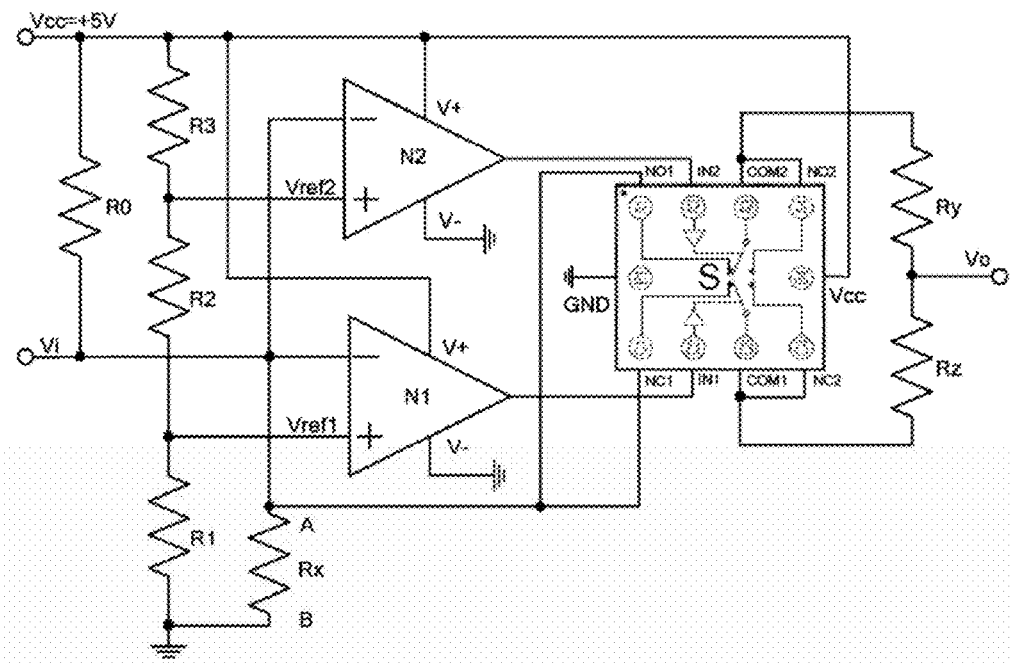
FIG. 2 is a circuit diagram of the impedance matching of the wireless access box interface in accordance with the first application example of the present invention.
Figure 3:
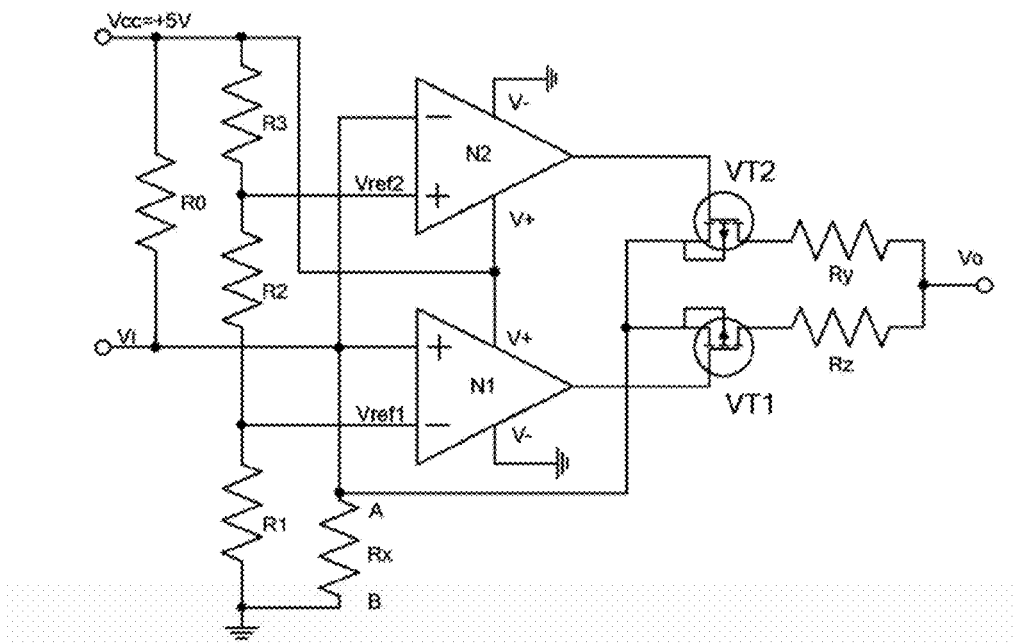
FIG. 3 is a circuit diagram of the impedance matching of the wireless access box interface in accordance with the second application example of the present invention.

FIG. 2 and FIG. 3 show two implementation solutions of the circuit for impedance matching of the wireless access box interface, wherein, the methods for implementing the peripheral impedance detection module (the ADC detection module) and the impedance matching module are the same in the two solutions, the analog switch switching module is implemented by using an analog switch in the solution in FIG. 2, and in the solution in FIG. 3, the analog switch switching module is implemented with two FETs.

THE FIRST APPLICATION EXAMPLE

FIG. 2 shows an impedance matching circuit of a wireless access box interface in accordance with the first application example of the present invention, wherein, the ADC detection module comprises the resistor R0, the resistor R1, the resistor R2, the resistor R3, the voltage comparator N1 and the voltage comparator N2, wherein, one end of the resistor R0 is connected to the power supply Vcc, the other end is connected to the impedance Rx of the subscriber telephone, as well as the negative input ends of the voltage comparator N1 and the voltage comparator N2; one end of the resistor R1 is connected to the ground, and the other end is connected to the positive input end of the voltage comparator of N1 and the resistor R2; one end of the resistor R2 is connected to the positive input end of the voltage comparator N1 and the resistor R1, and the other end is connected to the positive input end of the voltage comparator N2 and the resistor R3; one end of the resistor R3 is connected to the system power supply Vcc, and the other end is connected to the positive input end of the voltage comparator N2 and the resistor R2; the resistor R1, the resistor R2 and the resistor R3 are divider resistors to provide the reference voltages Vref1 and Vref2 of the voltage comparator N1 and the voltage comparator N2; the output ends of the voltage comparator N1 and the voltage comparator N2 are connected to the analog switch switching module, according to the value of the impedance Rx of the subscriber telephone, the voltage comparator N1 and the voltage comparator N2 output high or low level.

The system power supply Vcc, whose voltage is +5V, is used to supply power to the whole impedance matching circuits, and supply power to respectively the two voltage comparators N1 and N2, and the analog switch switching module, meanwhile through the voltage division, provide the reference voltages Vref1 and Vref2 and the input voltage V1 to the two comparators N1 and N2.

The two reference voltages are Vref1=1.8V and Vref2=3.3V, said reference voltages can be changed by changing the value of the three divider resistors R1, R2 and R3 according to the practical applications.

The input voltage V1 of the voltage comparators N1 and N2 is obtained by dividing the system power supply Vcc according to the impedance Rx of the subscriber telephone and the resistor R0, the input voltage V1 of the comparators changes dynamically according to the difference of the value of the impedance Rx of the subscriber telephone. Since there are three kinds of impedance of the subscriber telephones, there are three values of the input voltage V1 of the comparator N1. Moreover, according to a reasonable selection of the value of the resistor R0, the voltage V1 can be adjusted into three different ranges, respectively three voltage ranges of 0-1.8V, 1.8V-3.3V and 3.3V-5V, therefore, according to the difference of the input voltage V1 of the comparator, the subscriber telephones with the three impedances can be distinguished.

Said impedance matching module comprises the resistor Ry and the resistor Rz; the analog switch switching module is an analog switch S, the IN1 end of the analog switch S is connected to the output end of the voltage comparator N1, the IN2 end of the analog switch S is connected to the output of the voltage comparator N2, the NO1 and NC1 of the analog switch S are connected to the end of the impedance Rx of the subscriber telephone that is connected to the ground, the NO2 is connected to one end of the resistor Ry, and the NC2 is connected to one end of the resistor Rz.

The same path of signal voltage is input in the two voltage comparators N1 and N2, but the values of the reference voltages Vref1 and Vref2 at the in-phase input ends of the two-level circuit are different. The reference voltage of the N1 is Vref=1.8V, and the reference voltage of the N2 is Vref2=3.3V. Depending on the difference of the impedance Rx of the subscriber telephone, the input voltage V1 of the comparators is also different, and there are a total of the following three cases.

(1) When the impedance Rx of the client telephone is 75 ohm, the input voltage of the comparator is 0<Vi<1.8V, the comparators N1 and N2 output high level, and their state is "1". The NC1 and NC2 ends of the analog switch S are open (that is, the NC1 and NC2 ends are connected directly), at this time, the total input impedance is R=Rx+Rz=75+75=150 ohm.

(2) When the impedance Rx of the subscriber telephone is Rx=100 ohm, the input voltage of the comparators is 1.8V<Vi<3.3V, the comparator N1 outputs low level, and its state changes to "0"; the comparator N2 still outputs high level, and the state is still "1". The NC1 and N02 ends of the analog switch S are open (that is, the NC1 end and the N02 end are connected directly), at this time, the total input impedance is R=Rx+Ry=100+50=150 ohms.

(3) When the impedance of the subscriber telephone is Rx=120 ohm, the input voltage of the comparator is 3.3V<Vi<5V, the comparators N1 and N2 output low level, their states are "0". The analog switch S is in the state of fully-conducting, that is, all the four ends NC1, NC2, NO1 and NO2 are open (that is, the four ports NC1, NC2, NO1 and NO2 are connected), at this time, the total input impedance is R=Rx+RY//Rz=120+50×75/(50+75)=120+30=150 ohm. Wherein, the Ry//Rz indicates that the Ry is connected to the Rz in parallel.

THE SECOND APPLICATION EXAMPLE

FIG. 3 shows an impedance matching circuit of the wireless access box interface in accordance with the second application example of the present invention, wherein, the peripheral impedance detection module and the impedance matching module are the same as their peers in the first application example, the analog switch switching module consists of two field effect transistors VT1 and VT2 which are P-channel CMOS type, wherein, the grid of the FET VT1 is connected to the output end of the voltage comparator N1, the grid of the FET VT2 is connected to the output end of the voltage comparator N2, and the drains of the FETs VT1 and VT2 are connected to the end of the impedance Rx of the subscriber telephone that is not connected to the ground, the source of the FET VT1 is connected to one end of the resistor Ry, and the source of the FET VT2 is connected to one end of the resistor Rz.

The same path of signal voltage is input in the two voltage comparators N1 and N2, but the values of the reference voltages Vref1 and Vref2 of the in-phase input ends of the two-level circuit are different. The reference voltage of the N1 is Vref=1.8V, and the reference voltage of the N2 is Vref2=3.3V. Depending on the difference of the impedance of the subscriber telephone, the input voltage V1 of the comparators is also different, and there are a total of the following three cases.

(1) When the impedance of the subscriber telephone Rx is 75 ohm, the input voltage of the comparator is $0<Vi<1.8V$, the comparator N1 outputs low level, and its state is "0"; the comparator N2 outputs high level, and its state is "1". The VT1 is in conducting state, and the VT2 is in non-conducting state. At this time, the total input impedance is $R=Rx+Rz=75+75=150$ ohm.

(2) When the impedance of the subscriber telephone is Rx=100 ohm, the input voltage of the comparators is $1.8V<Vi<3.3V$, the comparator N1 outputs high level, and its state changes to "1"; the comparator N2 outputs low level, and its state is still "0". The VT1 is in the non-conducting state, and the VT2 is in conducting state, at this time, the total input impedance is $R=Rx+Ry=100+50=150$ ohm.

(3) When the impedance of the subscriber telephone is Rx=120 ohm, the input voltage of the comparators is $3.3V<Vi<5V$, the comparators N1 and N2 output low level, their states are "0". The VT1 and the VT2 are in the conducting state, at this time, the total input impedance is $R=Rx+RY//Rz=120+50\times75/(50+75)=120+30=150$ ohm.

Figure 4:
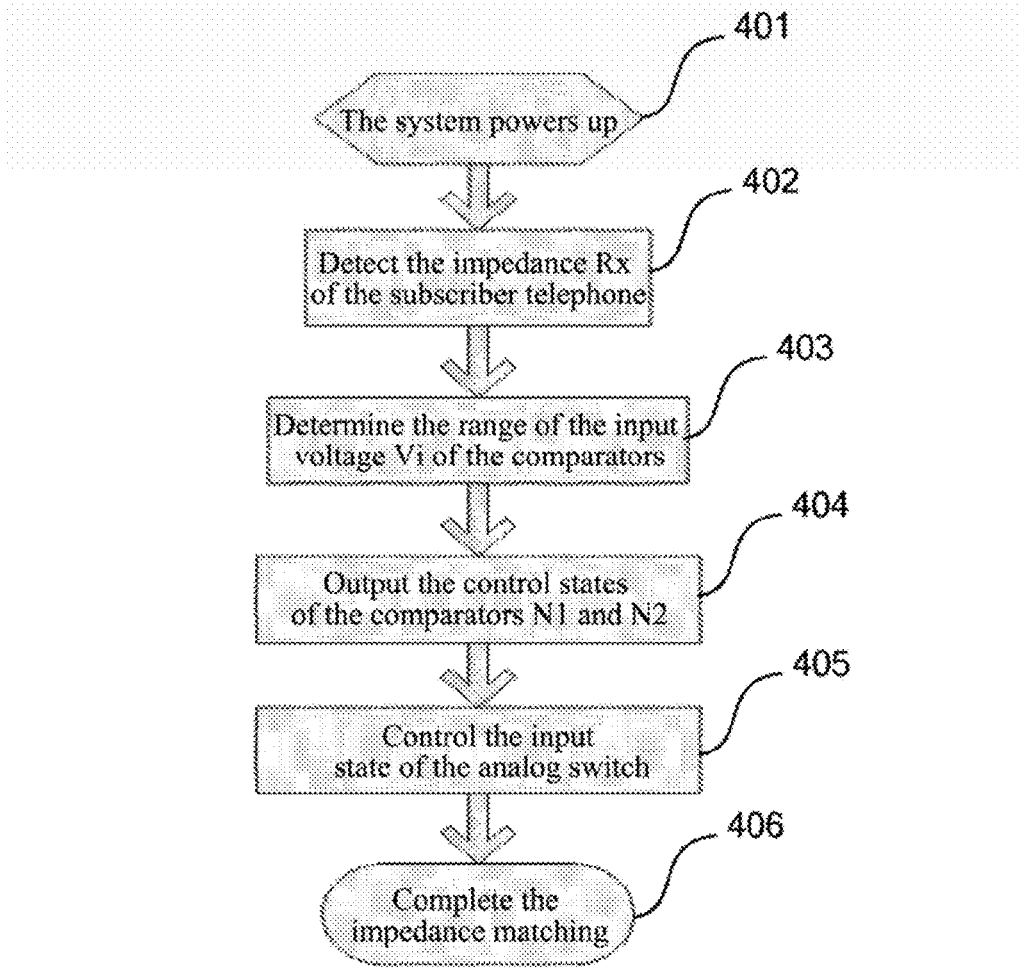
FIG. 4 is a flow chart of the impedance matching of the wireless access box interface in accordance with an application example of the present invention.

FIG. 4 is a flow chart of impedance matching with reference to FIG. 2 and FIG. 3, comprising the following steps:

step 401, the system powers up and provides a voltage of Vcc=+5 V;

step 402, the internal impedance Rx of the subscriber telephone is detected through the AB cable;

step 403, the system power supply Vcc is voltage divided by the R0 and Rx to obtain the input voltage V1 of the comparators, the three Rx divide the Vi into three voltage ranges;

step 404, the comparators N1 and N2 output different states according to the different ranges of the voltage values of the Vi, which are divided into three cases;

step 405, the input and output of the analog switch switching module is controlled through the different states output in the step 404, to perform the specific impedance matching;

step 406, complete the impedance matching.

The person of ordinary skill in the art can understand that all or part of the steps in the aforementioned method can be completed by a program instructing the related hardware, and the program can be stored in a computer readable storage medium, such as a read-only memory, disk, or CD-ROM. Optionally, all or part of the steps in the aforementioned embodiments can also be achieved with one or more integrated circuits, and accordingly, each module/unit in the aforementioned embodiments can be implemented in the form of hardware or software functional modules. The present invention is not limited to any particular form of hardware and software combination.

The above description is only the preferred embodiments of the present invention and is not used to limit the present invention, for the person of ordinary skill in the art, and the present invention can have a variety of modifications and changes. Without departing from the spirits and principles of the present invention, any changes, equivalent replacements and improvements made should be included within the protection scope of the present invention.

Industrial Applicability

Through the aforementioned solution of the present invention, the impedance matching can be implemented when the wireless access box communicates with phones with a variety of different impedance modes, the matching process is automatic and flexible and no manual configuration is needed, and the implementation technology is simple, reliable, and of low cost.

What is claimed is:

1. An impedance matching circuit, comprising a peripheral impedance detection module, an analog switch switching module and an impedance matching module that are connected in turn, wherein, the peripheral impedance detection module is set to: detect impedance of a subscriber telephone and output information about the impedance of the subscriber telephone;

the analog switch switching module is set to: provide an impedance matching path between the impedance of the subscriber telephone and the impedance matching module according to the information about the impedance of the subscriber telephone output by the peripheral impedance detection module;

the impedance matching module is set to: provide a corresponding impedance, through the impedance matching path provided by the analog switch switching module, to match said impedance of the subscriber telephone; wherein, the peripheral impedance detection module comprises an analog to digital conversion (ADC) detection module, and the ADC detection module is set to: output the information about the impedance of the subscriber telephone in the form of high or low level according to a value of the impedance of the subscriber telephone;

said ADC detection module comprises a resistor R0, a resistor R1, a resistor R2, a resistor R3, a voltage comparator N1 and a voltage comparator N2, wherein, one end of the resistor R0 is connected to the system power supply Vcc, and the other end of the resistor R0 is connected to the impedance Rx of the subscriber telephone, as well as negative input ends of the voltage comparator N1 and the voltage comparator N2; one end of the resistor R1 is connected to ground, and the other end of the resistor R1 is connected to a positive input end of the voltage comparator N1 and the resistor R2; one end of the resistor R2 is connected to the positive input end of the voltage comparator N1 and the resistor R1, and the other end of the resistor R2 is connected to the positive input end of the voltage comparator N2 and the resistor R3; one end of the resistors R3 is connected to the system power source Vcc and the other end of the resistor R3 is connected to the positive input end of the voltage comparator N2 and the resistor R2; the resistor R1, the resistor R2, and the resistor R3 are divider resistors and provide reference voltages to the voltage comparators N1 and N2; the output ends of the voltage comparators N1 and N2 are connected to the analog switch switching module, according to the value of the impedance Rx of the subscriber phone , the voltage comparator N1 and the voltage comparator N2 output high or low level.

2. The circuit of claim 1, wherein, said impedance matching module comprises a resistor Ry and a resistor Rz, and the analog switch switching module is further set to:

when both the voltage comparator N1 and the voltage comparator N2 output high level, set the impedance Rx of the subscriber telephone connect to the resistor Rz, and a total input impedance is the value of the impedance Rx of the subscriber telephone plus the value of the resistor Rz;

when the voltage comparator N1 outputs the low level and the voltage comparator N2 outputs the high level, set the impedance Rx of the subscriber telephone to connect to the resistor Ry, and the total input impedance is the value of the impedance Rx of the subscriber telephone plus the value of the resistor Ry;

when both the voltage comparator N1 and the voltage comparator N2 output the low level, set the impedance Rx of the subscriber telephone to connect to the resistor Ry and the resistor Rz, and the total input impedance is the value of the impedance Rx of the subscriber telephone plus the value of the resistor Ry parallel with the resistor Rz.

3. The circuit of claim 2, wherein, the analog switch switching module is an analog switch S, an IN1 end of the analog switch S is connected to the output end of the voltage comparator N1, and an IN2 end of the analog switch S is connected to the output end of the voltage comparator N2, NO1 and NC1 of the analog switch S are connected to an end of the impedance Rx of the subscriber telephone that is not connected to the ground, and NO2 of the analog switch S is connected to one end of the resistor Ry, and NC2 of the analog switch S is connected to one end of the resistor Rz; when both the voltage comparator N1 and the voltage comparator N2 output high level, the NC1 end and the NC2 end of the analog switch S are connected so that the impedance Rx of the subscriber telephone is connected to the resistor Rz; when the voltage comparator N1 outputs low level while the voltage comparator N2 outputs high level, the NC 1 end and the NO2 end of the analog switch S are connected so that the impedance Rx of the subscriber telephone is connected to the resistor Ry; when both the voltage comparator N1 and the voltage comparator N2 output low level, the four ends NC1, NC2, NO1 and NO2 of the analog switch S are connected so that the impedance Rx of the subscriber telephone is connected to the resistor Ry and the resistor Rz.

4. The method of claim 3, wherein, the value of the resistor Ry is 5 ohm, the value of the resistor Rz is 75 ohm, and the total input impedance is 150 ohm.

5. The circuit of claim 2, wherein, said analog switch switching module comprises a field effect transistor (FET) VT1 and a field effect transistor VT2, wherein, a grid of the FET VT1 is connected to the output end of the voltage comparator N1, and the grid of the FET VT2 is connected to the output end of the voltage comparator N2, drains of the FET VT1 and the FET VT2 are connected to the end of the impedance Rx of the subscriber telephone that is not connected to the ground, a source of the FET VT1 is connected to one end of the resistor Ry, and the source of the FET VT2 is connected to one end of the resistor Rz; when both the voltage comparator N1 and the voltage comparator N2 output high level, the FET VT1 is in conducting state and the VT2 FET is in non-conducting state so that the impedance Rx of the subscriber telephone is connected to the resistor Rz; when the voltage comparator N1 outputs low level and the voltage comparator N2 outputs high level, the FET VT1 is in the non-conducting state and the FET VT2 is in the conducting state, so that the impedance Rx of the subscriber telephone is connected to the resistor Ry; when the voltage comparator N1 and the voltage comparator N2 output low level, the field effect transistor VT1 and the field effect transistor VT2 are in the conducting state, so that the impedance Rx of the subscriber telephone is connected to both the resistor Ry and the resistor Rz.

6. The method of claim 5, wherein, the value of the resistor Ry is 50 ohm, the value of the resistor Rz is 75 ohm, and the total input impedance is 150 ohm.

7. The method of claim 2, wherein, the value of the resistor Ry is 50 ohm, the value of the resistor Rz is 75 ohm, and the total input impedance is 150 ohm.

8. The method of claiml, wherein, the reference voltage provided by the resistor R1, the resistor R2, and the resistor R3 for the voltage comparator N1 is +1.8V, and the reference voltage provided for the voltage comparator N2 is +3.3V, and the system power supply Vcc is +5V.

9. The method of claim 8, wherein, the value of the resistor Ry is 50 ohm, the value of the resistor Rz is 75 ohm, and the total input impedance is 150 ohm.

10. A wireless access box, comprising the impedance matching circuit of claim 1.

* * * * *